(12) United States Patent
Peng et al.

(10) Patent No.: US 6,245,467 B1
(45) Date of Patent: Jun. 12, 2001

(54) PATTERNED MASK AND A DEEP TRENCH CAPACITOR FORMED THEREBY

(75) Inventors: Hsin-Tang Peng; Jacson Liu, both of Hsinchu (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/375,574

(22) Filed: Aug. 17, 1999

(30) Foreign Application Priority Data

Apr. 2, 1999 (TW) ................................. 88106334

(51) Int. Cl.[7] ................................ G03F 9/00; H05K 0/00
(52) U.S. Cl. ................................ 430/5; 430/311; 438/386
(58) Field of Search ............................. 430/5, 322, 311, 430/313; 438/243, 386

(56) References Cited

U.S. PATENT DOCUMENTS 6,020,091 * 2/2000 Lee .................................... 430/5
6,064,466 * 2/2000 Sato et al. ........................... 430/5

* cited by examiner

*Primary Examiner*—S. Rosasco
(74) *Attorney, Agent, or Firm*—Peter F. Corless; Edwards & Angell, LLP

(57) ABSTRACT

A method for fabricating a deep trench capacitor by using a patterned mask having a specific pattern thereon is provided. The specific pattern is formed by caving at least one side thereof in. The method for fabricating a deep trench capacitor includes the steps of providing a substrate, forming a deep trench having an opening by using the patterned mask with the above-described pattern within a predetermined rectangular area on the substrate, and utilizing the deep trench to form a deep trench capacitor.

16 Claims, 8 Drawing Sheets

PATTERNED MASK AND A DEEP TRENCH CAPACITOR FORMED THEREBY

FIELD OF THE INVENTION

The present invention relates to a deep trench capacitor, and more particularly to a method for fabricating a deep trench capacitor by using a patterned mask having a specific pattern thereon.

BACKGROUND OF THE INVENTION

At modem age, the integration level of integrated circuit (IC) is rising so that the improvement of IC fabrication technique is becoming significant. Nowadays, a dynamic random access memory (DRAM) is the most common component employed in a very-large-scale integrated (VLSI) circuit. For a DRAM cell composed of a transistor and a capacitor, the surface area of the capacitor has the indication of the storage capacity of DRAM.

Normally, the capacitance of the DRAM can be increased by increasing the surface area of the capacitor. However, even though the capacitance of the capacitor is increased, the integration level will be lowered.

In the current technology of fabricating the capacitor adopted in DRAM, two most widely adopted capacitors in a DRAM cell are a deep trench capacitor and a stack capacitor because they can increase the capacitance of capacitor but the integration level will not be affected. The deep trench capacitor which is fabricated by the trench isolation technique is the most popular capacitor used in a DRAM cell. Nevertheless, some defects still exist in the technology of fabricating deep trench capacitor and the performance of DRAM is restricted.

Please refer to FIG. 1 which shows the patterns of a patterned mask used for fabricating the deep trench capacitor. Conventionally, a patterned photo mask is employed to transfer the pattern to the surface of silicon wafer for forming the opening of the deep trench capacitor.

Please refer to FIG. 2(a) which is the perspective view of the deep trench which is formed by photolithography using the pattern shown in FIG. 1 and then performing an etching process. Normally, the area of the bottom and side walls of the deep trench indicates the effective area of the deep trench capacitor. However, as the integration level of DRAM is rising the dimension is minimized, and the opening of the deep trench capacitor transferred from the patterned mask is inevitably getting small as well. Thus, the effective area of the deep trench capacitor is reduced. That causes a decrement in the capacitance of the capacitor so that the DRAM cell using deep trench capacitor can not work properly. Therefore, several negative influences will occur, for instance, the data retention time of DRAM will become too short to retain the data.

While the opening of the deep trench capacitor is reduced, the opening of the deep trench capacitor formed by transferring the pattern shown in FIG. 1 to the surface of the substrate is shown in FIG. 2(b). It is obvious that as shown in FIG. 2(b), the so-called corner rounding effect is generated, wherein the four corners of the pattern shown in FIG. 2(b) are getting round because of the optical proximity effect (OPE), thereby resulting in a reduced effective area. Conventionally, a solution of the OPE is to apply an optical proximity correction (OPC) program to correct the pattern (the pattern after correction is shown in FIG. 2(c)). However, the OPC program is very complicated, and it is not an efficient way to solve the problem of OPE at the present time.

SUMMARY OF THE INVENTION

Hence, an object of the present invention is to provide a patterned mask having a specific pattern thereon for increasing the effective area of the deep trench capacitor.

Another object of the present is to provide a method for fabricating a deep trench capacitor.

Another further object of the present invention is to avoid reducing the effective area of the deep trench capacitor.

Another yet object of the present invention is to avoid corner rounding phenomenon in a more easy and efficient way.

For the above purposes, the patterned mask for fabricating a deep trench capacitor is developed, wherein the patterned mask has a specific pattern to be transferred to the surface of a substrate for forming a deep trench within a predetermined rectangular area, and the pattern is shaped by denting at least one side thereof.

Generally, the substrate is a silicon substrate and the deep trench is formed by photolithography and an etching process.

Preferably, the pattern is an I-shaped pattern and hence the opening of the deep trench is also an I-shaped pattern.

Broadly, the pattern is a concavity-shaped pattern and thus the opening of the deep trench is also a concavity-shaped pattern.

Certainly, the patterned mask is a photo mask.

A method for fabricating a deep trench capacitor includes the following steps : (a) providing a substrate, (b) forming a deep trench having an opening formed by transferring a pattern of a patterned mask to the surface of the substrate within a predetermined rectangular area, wherein the pattern is shaped by caving at lease one side thereof in, and (c) utilizing the deep trench to form a deep trench capacitor.

Now the present invention may best be understood through the following descriptions with reference to the accompanying drawings, in which:

DETAILED DESCRIPTION OF THE PREFERRED EMBODIMENTS

The present invention will now be described more minutely with reference to the following embodiment. It is to be noted that the following descriptions of preferred embodiment of this invention are presented herein for the purpose of illustration and description only. It is not to be restricted to the precise form disclosed.

Figure 1:
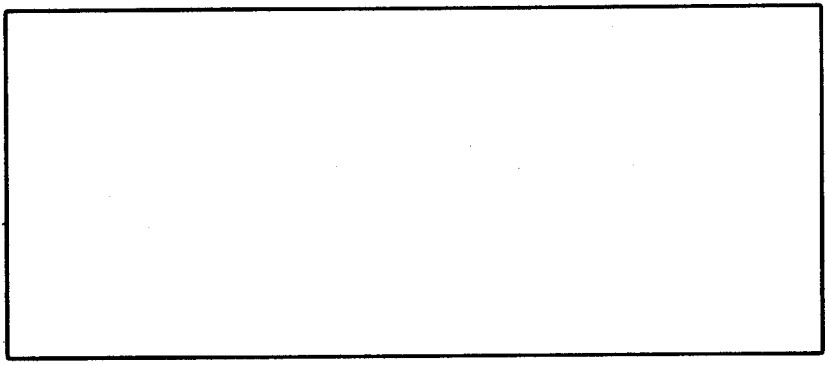
FIG. 1 illustrates the patterns of a patterned mask for fabricating the deep trench capacitor according to the prior art.
Figure 1:
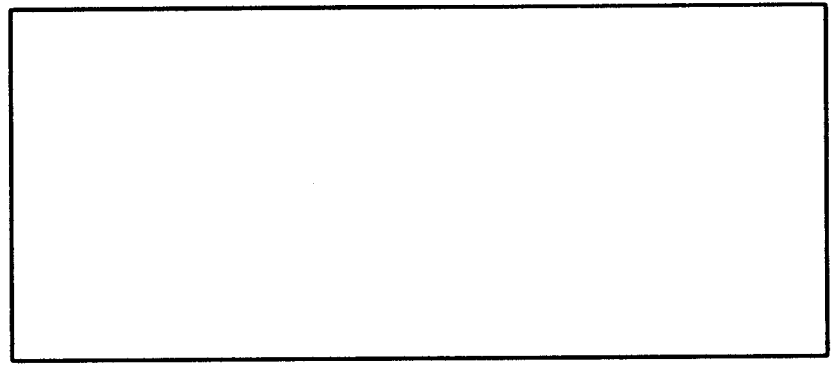
Figure 2A:
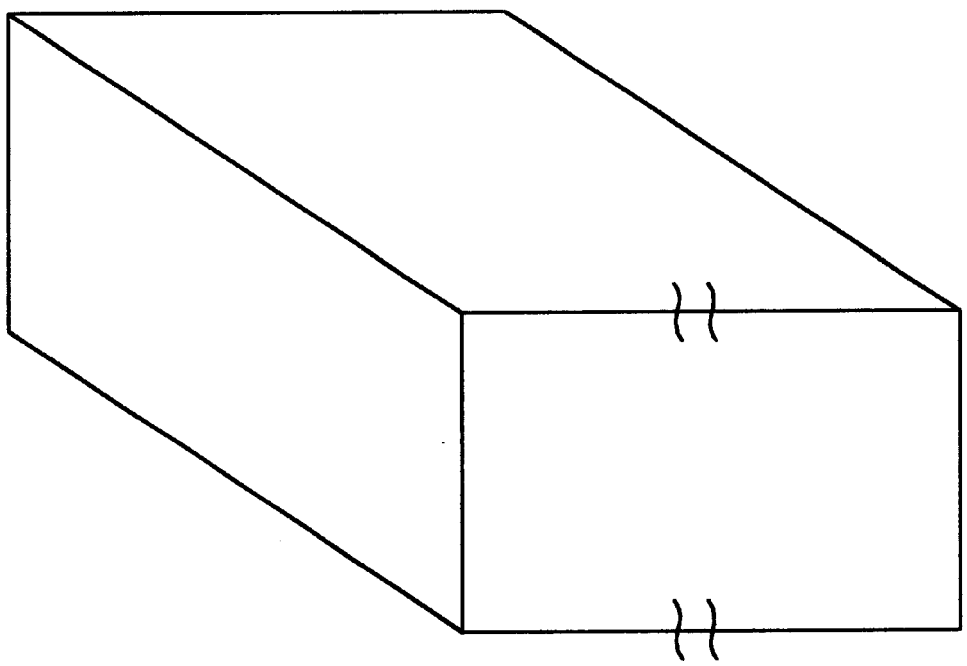
FIG. 2(a) is a perspective view showing the deep trench formed by using the pattern of FIG. 1.
Figure 2A:
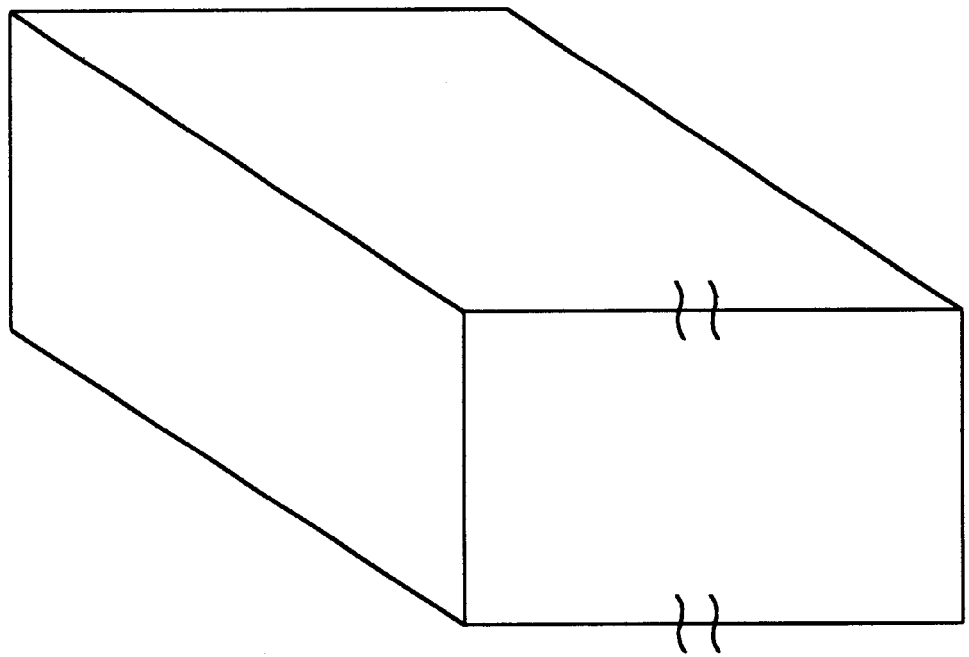
Figure 2B:
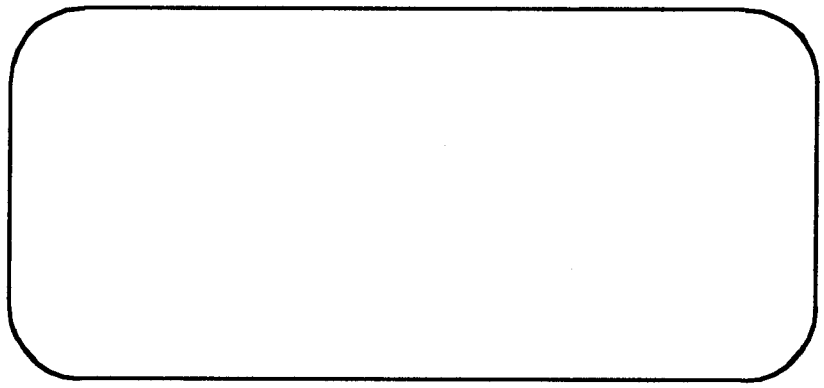
FIG. 2(b) illustrates the opening of the deep trench by using the pattern of FIG. 1 while the dimension is shrunk.
Figure 2B:
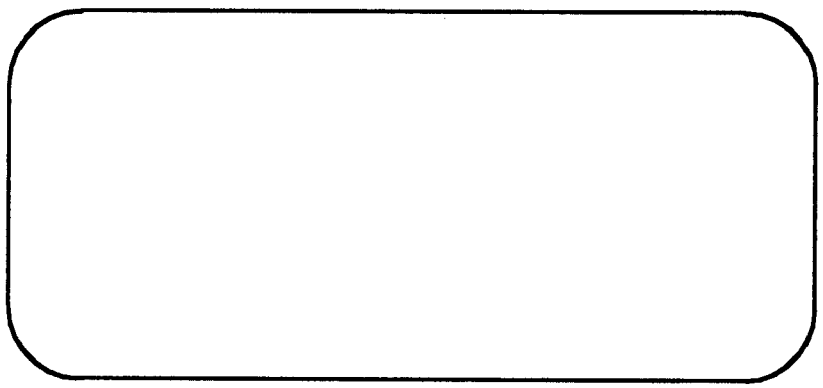
Figure 2C:
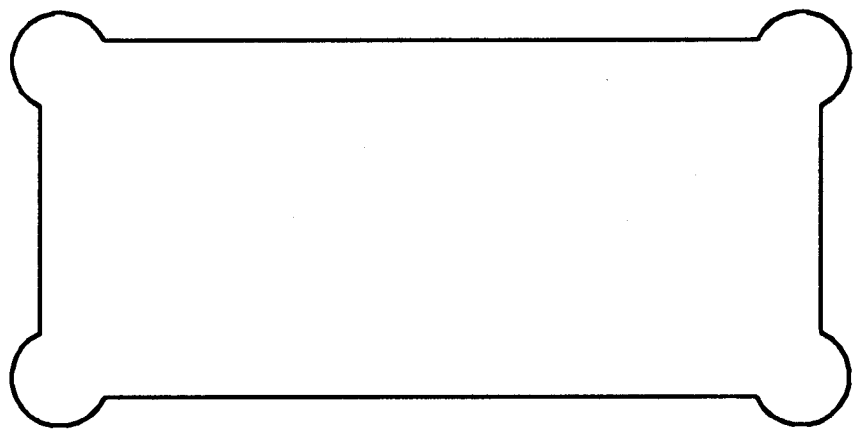
FIG. 2(c) illustrates the pattern of FIG. 1 obtained after executing the optical proximity correction (OPC) program.
Figure 2C:
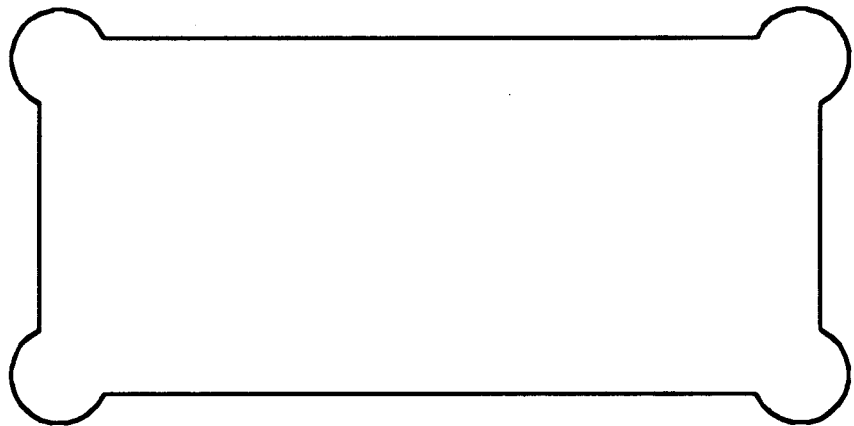
Figure 3:
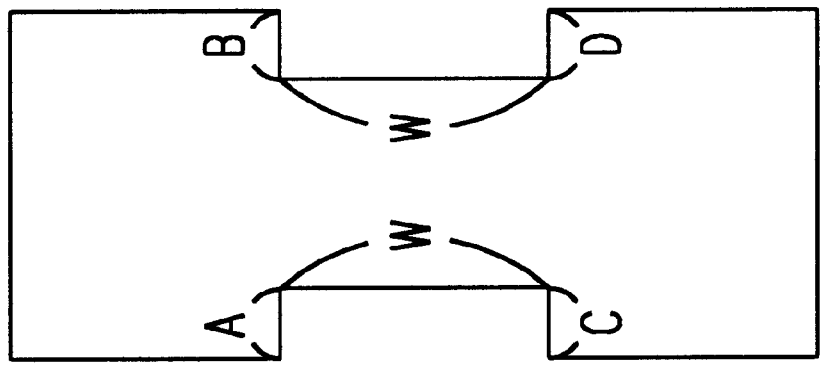
FIG. 3 illustrates a preferred embodiment of the pattern of the patterned mask according to the present invention.
Figure 3:
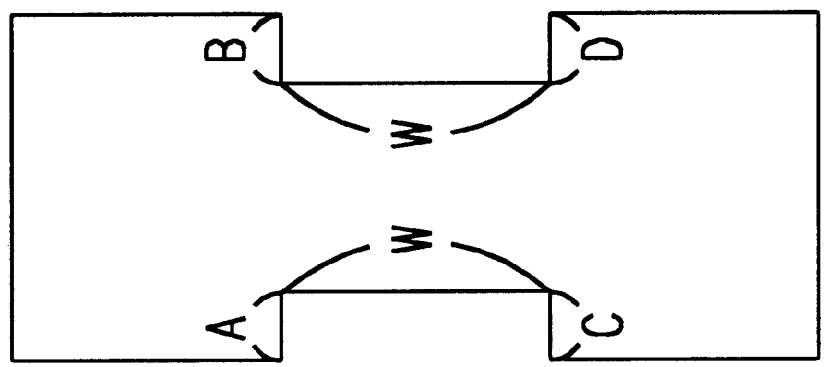
Figure 4:
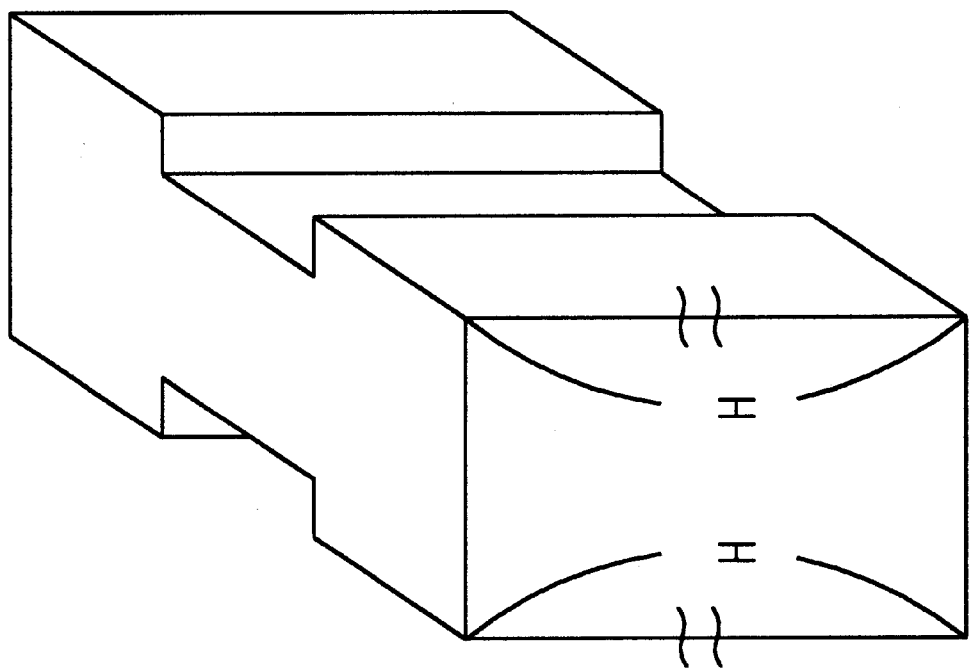
FIG. 4 is a perspective view showing the deep trench formed by using the pattern of FIG. 3.
Figure 4:
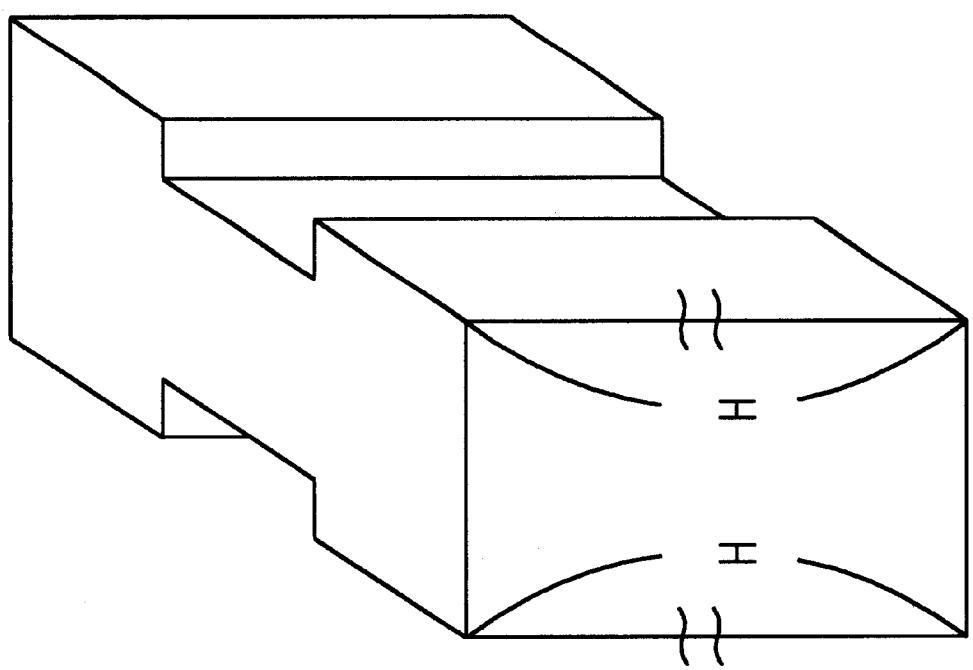

Please refer to FIG. 3. The pattern shown in FIG. 3 is an I-shaped pattern which is transferred to the surface of the substrate for forming the opening of the deep trench. The deep trench formed by using the pattern of FIG. 3 is illustrated in FIG. 4. It is transparent that the area of side walls will increase by the four rectangle areas having the same length of H and the widths A, B, C, and D respectively.

Figure 5:
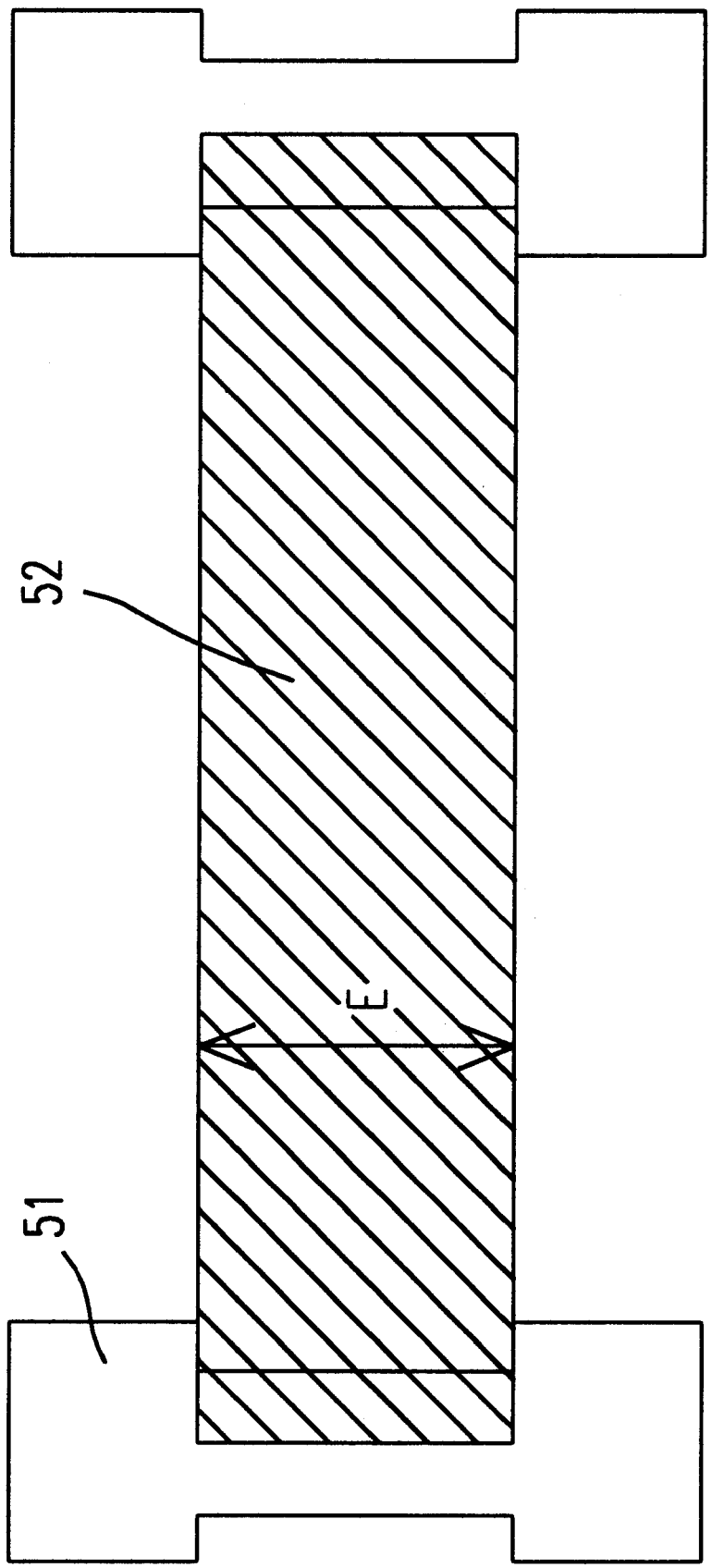
FIG. 5 is a top view diagram showing the deep trench capacitor formed by using the pattern of FIG. 3, wherein the slant region is its active area.

Please refer to FIG. 5. The slant region in FIG. 5 indicates the active area 52. The deep trench capacitor 51 is fabricated by using the patterned mask of FIG. 3. It is worthy to note that the length of W shown in FIG. 3 depends on the width E of the active area 52 shown in FIG. 5 and the overlapped region occupied by the deep trench capacitor 51 and the active area 52, and can be adjusted further.

Figure 6:
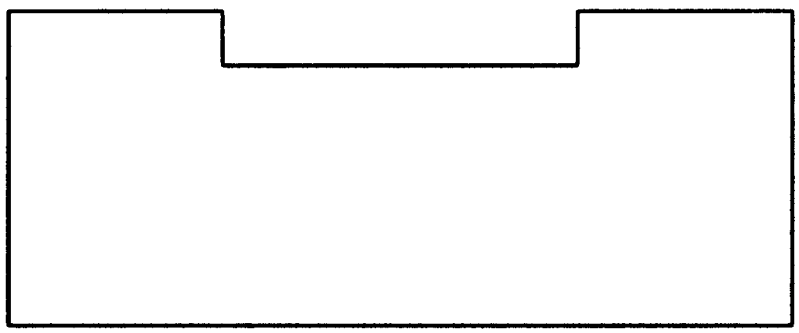
FIG. 6 illustrates another preferred embodiment of the pattern of the patterned mask according to the present invention.

Except for the above-described preferred embodiment, FIG. 6 illustrates another embodiment according to the present invention.

The effective area of the capacitor in this preferred embodiment is increased by three to fifteen percent, and the capacitance is increased as well. Comparing the conventional mask pattern with that of the present invention, the latter can efficiently increase the surface area of the capacitor so that the capacitance will be increased even though the predetermined rectangular area and the depth H of the deep trench are the same. Moreover, the etching depth will be reduced and the aspect ratio will become smaller. Besides, the etching reliability will be raised.

Although the problem of OPE can be solved by applying the OPC program, the present invention provides a more efficient and convenient method for replacing the OPC program.

While the invention has been described in terms of what are presently considered to be the most practical and preferred embodiments, it is to be understood that the invention need not be restricted to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What we claim is:

1. A patterned mask for fabricating a deep trench capacitor, comprising a specific pattern to be transferred to a predetermined rectangular area on the substrate for forming a deep trench within said predetermined rectangular area, wherein said specific pattern is shaped by denting at least one side of said rectangular area thereof.

2. A patterned mask according to claim 1, wherein said substrate is a silicon substrate.

3. A patterned mask according to claim 1, wherein said deep trench is formed by photolithography and an etching process.

4. A patterned mask according to claim 1, wherein said specific pattern is an I-shaped pattern.

5. A patterned mask according to claim 4, wherein said deep trench has an I-shaped opening.

6. A patterned mask according to claim 1, wherein said specific pattern is a concavity-shaped pattern.

7. A patterned mask according to claim 6, wherein said deep trench has a concavity-shaped opening.

8. A patterned mask according to claim 1, wherein said patterned mask is a photo mask.

9. A method for fabricating a deep trench capacitor, comprising:

providing a substrate;

forming a deep trench having an opening transferred from a pattern of a patterned mask within a predetermined rectangular area on said substrate, wherein said pattern is shaped by denting at least one side side of said rectangular area thereof; and utilizing said deep trench to form a deep trench capacitor.

10. The method according to claim 9, wherein said substrate is a silicon substrate.

11. The method according to claim 9, wherein said deep trench is formed by photolithography and an etching process.

12. The method according to claim 9, wherein said pattern is an I-shaped pattern.

13. The method according to claim 12, wherein said opening is an I-shaped opening.

14. The method according to claim 9, wherein said pattern is a concavity-shaped pattern.

15. The method according to claim 14, wherein said opening is a concavity-shaped opening.

16. The method according to claim 9, wherein said patterned mask is a photo mask.

* * * * *